(12) United States Patent
Fazan et al.

(10) Patent No.: US 6,835,634 B1
(45) Date of Patent: Dec. 28, 2004

(54) STREAMLINED FIELD ISOLATION PROCESS

(75) Inventors: Pierre C. Fazan, Boise, ID (US); Viju K. Mathews, Boise, ID (US); Nanseng Jeng, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1186 days.

(21) Appl. No.: 09/037,945

(22) Filed: Mar. 10, 1998

Related U.S. Application Data

(63) Continuation of application No. 08/519,451, filed on Aug. 25, 1995, now abandoned.

(51) Int. Cl.[7] ............................................. H01L 21/762
(52) U.S. Cl. ...................................................... 438/452
(58) Field of Search ................................ 438/FOR 229, 438/452, FOR 129

(56) References Cited

U.S. PATENT DOCUMENTS

| | | |
|---|---|---|
| 4,109,030 A | 8/1978 | Briska et al. |
| 4,243,435 A | 1/1981 | Barile et al. |
| 4,247,343 A | 1/1981 | Kruzhanov et al. |
| 4,290,184 A | 9/1981 | Kuo |
| 4,551,910 A | 11/1985 | Patterson ..................... 29/576 |
| 4,624,046 A | 11/1986 | Shideler et al. |
| 4,979,803 A | 12/1990 | McGuckin et al. |
| 5,134,089 A | 7/1992 | Barden et al. ................. 437/70 |
| 5,151,381 A | 9/1992 | Liu et al. ...................... 437/69 |
| 5,218,214 A | 6/1993 | Tyson et al. |
| 5,470,783 A | 11/1995 | Chiu et al. |
| 5,502,009 A | 3/1996 | Lin |
| 5,543,343 A | 8/1996 | Bryant et al. |
| 5,637,528 A | 6/1997 | Higashitani et al. |

FOREIGN PATENT DOCUMENTS

| | | | |
|---|---|---|---|
| DE | 266885 | * | 4/1989 |
| DE | 266885 A1 | * | 4/1989 |

OTHER PUBLICATIONS

Miyoshi, H., et al., "Selective Oxidation of Silicon in High Pressure Steam", Journal of the Electrochemical Society, vol. 125, No. 11, pp. 1824–1828, Nov. 1978.*

Zeto, R. J., et al., "Low Temperature Thermal Oxidation of Silicon by Dry Oxygen Pressure above 1 Atm", Journal of the Electrochemical Society, vol. 122, No. 10, Oct. 1975.*

Kooi, et al., "Formation of Silicon Nitride at a Si–SiO$_2$ Interface during Local Oxidation of Silicon and during Heat–Treatment of Oxidized Silicon in NH$_3$ Gas", J. Electrochem Soc. Solid–State Science and Technology, Jul. 1976, vol. 123, No. 7, pp. 1117–1120.

(List continued on next page.)

*Primary Examiner*—George Fourson
(74) *Attorney, Agent, or Firm*—Knobbe, Martens, Olson & Bear, LLP

(57) ABSTRACT

A field isolation process performed on a silicon wafer is carried out by high pressure oxidation. Using oxygen rather than water vapor as the oxidant substantially eliminates nitride inclusions via the Kooi effect. Preferred high pressure field oxidation processes simplify all CMOS flows by eliminating the need for sacrificial oxide growth and removal steps.

11 Claims, 4 Drawing Sheets

OTHER PUBLICATIONS

Van Zant, Microchipn Fabrication; A Practical Guide to Semiconductor Processing, McGraw–Hill, 1997, p. 159–160, 593.

"Extended Abstracts of the Electrochemical Society Meeting", Fall 1993, pp. 281–282.

Sze, S.M., "High–Pressure Oxidation", *VLSI Technology*, 2d Edition, McGraw–Hill, Inc., New York, 1988, pp. 121–123.

Wolf, Stanley, "Isolation Technologies for Integrated Circuits", *Silicon Processing for the VLSI Era vol. 2: Process Integration*, Lattice Press, Sunset Beach, CA, 1990, pp. 17–27.

Marshall, S. et al., "Dry Pressure Local Oxidation of Silicon for IC Isolation", *Journal of the Electrochemical Society* (Oct. 1975), vol. 122, No. 19, pp. 1411–1412.

* cited by examiner

STREAMLINED FIELD ISOLATION PROCESS

REFERENCE TO RELATED APPLICATION

This application is a continuation of U.S. application No. 08/519,451 filed Aug. 25, 1995, now abandoned.

FIELD OF THE INVENTION

The invention relates generally to silicon integrated circuit fabrication. In particular, the invention pertains to the device isolation processes involving the local oxidation of silicon.

BACKGROUND OF THE INVENTION

Implementing electric circuits in an integrated process involves connecting isolated devices through specific electrical paths. In silicon ultra large scale integration, effective device isolation becomes increasingly important as device dimensions become smaller and packing density rises.

In conventional Metal-Oxide-Silicon (MOS) device fabrication, device isolation is often implemented by means of recessed or semi-recessed silicon dioxide ($SiO_2$ or "oxide") regions in the non-active or field areas of the silicon substrate. This so-called Local Oxidation of Silicon (LOCOS) has become the most widely used isolation technology. In various forms, it remains the technique of choice for MOS device isolation.

A basic LOCOS process begins with the formation of a relatively thin (20–60 nm) pad-oxide layer over substantially an entire clean silicon (Si) wafer. Following the pad-oxide deposition, a silicon nitride ($Si_3N_4$ or "nitride") layer of about 100–200 nm thick is deposited. Subsequently, the wafer is masked and the nitride/pad-oxide is etched to define the active regions. The exposed regions are the inactive or field regions wherein the field oxide is grown. Prior to oxide growth, optional dopant implants may be carried out to create channel-stops located beneath the field oxide. The field oxide is typically thermally grown at about atmospheric pressure by means of wet oxidation, at temperatures of about 1000° C. for 2–4 hours, resulting in oxide thicknesses in the range of 0.3–1.0 $\mu$m. Dry oxidation is usually not preferred because of the generally low oxidation rate which adds considerably to process throughput.

Even though the oxide grows substantially only within the regions defined by the masking nitride, some oxidant may diffuse laterally causing excess oxide to grow under the edges of the nitride mask, often forming a so-called "bird's beak" effect. The bird's beak presents several problems for device isolation. Modifications of the basic LOCOS isolation process have succeeded in reducing, the bird's beak considerably.

During the growth of the field oxide, another phenomenon occurs that causes defects in the structure, which later become detrimental to the thin gate oxide. Kooi, et al. (J. Electrochem. Soc., vol. 123, pp. 1117, 1976), discovered that a thin layer of silicon nitride can form on the silicon surface at the pad-oxide/silicon interface as a result of the reaction of ammonia ($NH_3$) and silicon. The ammonia is generated from the reaction between water vapor ($H_2O$) and the masking nitride during the field-oxidation step. The ammonia diffuses through the pad oxide and reacts with the silicon substrate to form silicon nitride spots or ribbons, sometimes called the white ribbon effect. Subsequently, when the gate oxide is grown, the growth rate becomes impeded at the locations where the silicon nitride has formed. The gate oxide is thus thinner at these locations than elsewhere, causing low-voltage breakdown of the gate oxide. One common way to eliminate this problem is to grow a "sacrificial" oxide layer after etching the masking nitride and pad-oxide layers. The sacrificial oxide is then removed before growing the final gate oxide. Clearly, however, the additional processes involved for eliminating the Kooi effect adds to the cost and complexity of ULSI fabrication.

SUMMARY OF THE INVENTION

It is an object of the present invention to provide a field isolation process which obviates the need for sacrificial oxide growth and removal to eliminate parasitic silicon nitride inclusions. It is a further object of the present invention to provide a field oxidation process which prevents the formation of silicon nitride inclusions at the silicon/silicon dioxide interface. It is yet another object of the present invention to provide a field oxidation process which eliminates the use of hydrogen-containing oxidants, thereby preventing silicon nitride formation concurrent with the field oxide formation and achieve the requisite field oxide growth.

In accordance with one aspect of the present invention, a field isolation process comprises growing a field oxide region on a semiconductor wafer by means of a hydrogen-free oxidant. Preferably the oxidant comprises substantially only oxygen and the field oxide process is preferably carried out at oxygen partial pressures greater than 10 atm and temperatures greater than about 900° C.

In accordance with another aspect of the present invention, a method of growing a field oxide region on a semiconductor wafer comprises growing a first portion of the field oxide region by means of exposing a portion of the wafer to a first oxidizing ambient comprising water vapor. The field oxide region is completed by further exposing the portion of the wafer to a second oxidizing ambient comprising oxygen.

In accordance with yet another aspect of the present invention, a field isolation region on a semiconductor substrate is formed by a process comprised of exposing the field region of the semiconductor wafer to an oxidizing ambient comprising substantially only oxygen. More preferably, the isolation region is first exposed to an oxidizing ambient comprising at least in part water vapor, and subsequently exposed to the oxidizing ambient comprised of substantially only oxygen.

These as well as other objects and attributes of the present invention will become more fully apparent from the following description with reference to the accompanying drawings.

DETAILED DESCRIPTION OF THE INVENTION

Figure 1A:
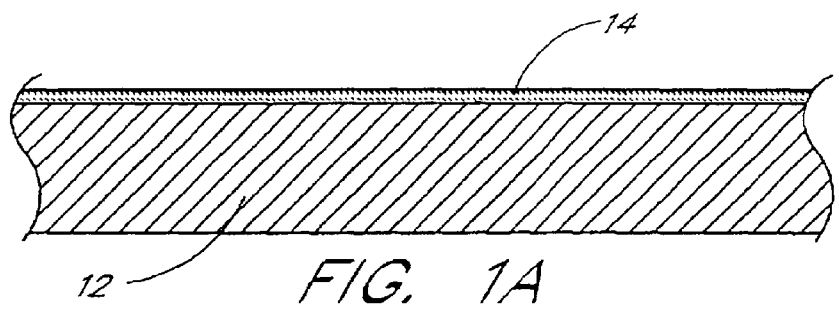
FIGS. 1A–1H is a schematic partial process flow illustrating a representative field isolation process and the accompanying Kooi effect.
Figure 1B:
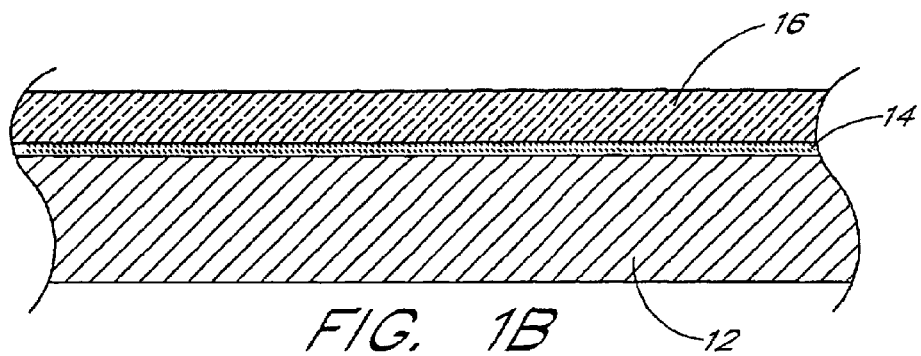

As shown in FIG. 1A, an exemplary conventional LOCOS process begins by depositing a buffer or pad-oxide layer ($SiO_2$) 14 of about 20–60 nm thick on a clean surface of a silicon wafer 12. The pad-oxide provides a stress relief buffer between the silicon surface and an overlaying silicon nitride layer. As shown in FIG. 1B, a layer of silicon nitride 16 of about 100–200 nm thick is deposited on the pad-oxide. Silicon nitride is typically deposited by a chemical vapor deposition (CVD) of dichlorosilane ($SiH_2Cl_2$) and ammonia ($NH_3$) at temperatures between 700° C. and 800° C., according to the overall reaction:

$$3SiH_2Cl_2 + 4NH_3 \rightarrow Si_3N_4 + 6HCl + 6H_2$$

Figure 1C:
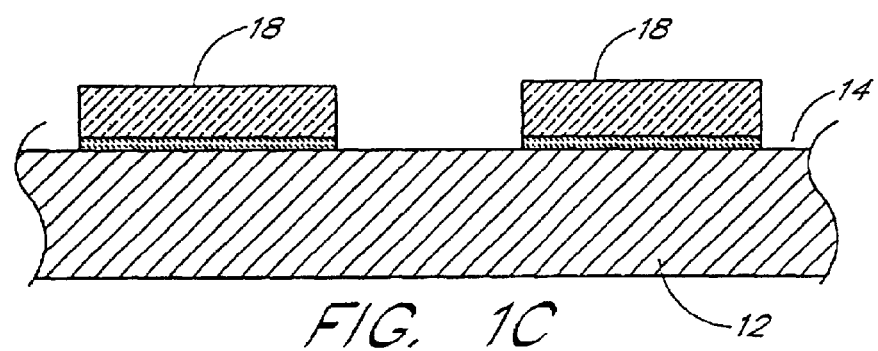
Figure 1D:
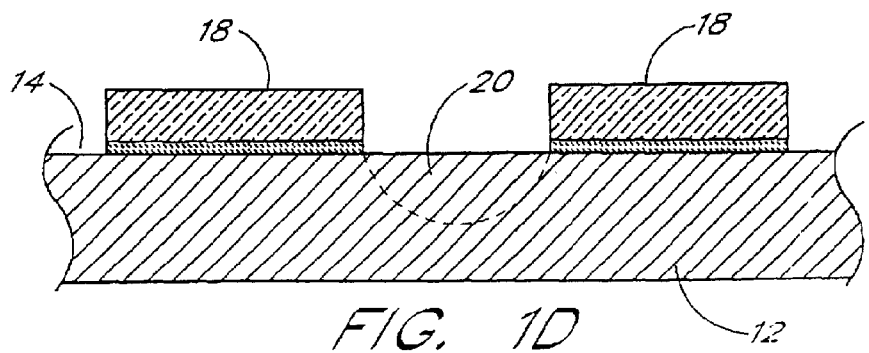

A photolithographic process is then used to define the active regions. A resist pattern is normally used to protect all of the areas where the active devices will be formed. The nitride layer is then dry etched and the pad-oxide is etched by either a wet-or-dry-chemical process. FIG. 1C illustrates an exemplary structure resulting from the masking and etch process. After the mask and etch process, optional dopant implants may be formed in the field regions, creating a channel-stop 20, as shown in FIG. 1D. The channel-stop 20 is intended to provide enhanced device isolation and is thus mentioned by way of example as a common practice in LOCOS process integration. Moreover, the channel-stop implant 20 may be performed in other ways, for example after field oxide growth. It will be appreciated that such channel-stop implant processes may be integrated in a variety of ways, and are optional in the context of the present invention.

The field oxide is thermally grown by means of wet oxidation according to the general formula:

$$Si\ (Solid) + 2H_2O \rightarrow SiO_2\ (Solid) + 2H_2$$

Figure 1E:
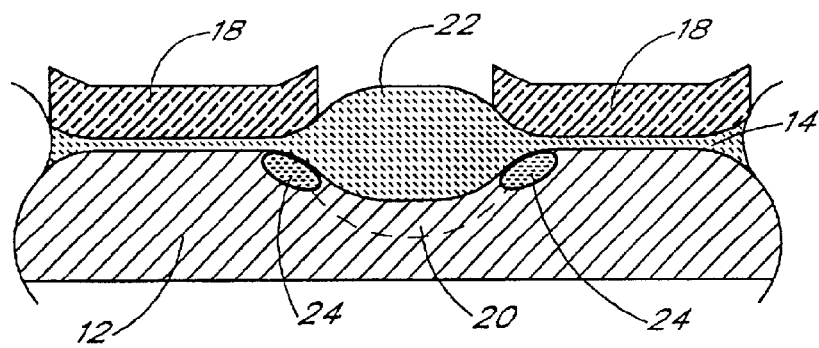

Typical field oxide layers 22 as shown in FIG. 1E are grown to thicknesses of about 0.3 to 1.0 μm. Wet oxidation is typically carried out at temperatures in the range of 900° C. to 1200° C. and oxidant partial pressures from about 0.2 to 25 atm. As a silicon oxidant, water vapor is conventionally preferable because of the generally high oxidation rate.

However, during growth of the field oxide 22, a parasitic inclusion of silicon nitride can form at the silicon/pad-oxide interface as a result of the reaction of released ammonia with silicon. Specifically, ammonia is released by the reaction of $Si_3N_4$ (Solid) and $H_2O$ present during wet oxidation according to the approximate formula:

$$Si_3N_4(solid) + 6H_2O \rightarrow 3SiO_2\ (solid) + 4NH_3$$

Ammonia released by the reaction diffuses through the $SiO_2$ pad-oxide layer and reacts with the silicon substantially at the $Si/SiO_2$ interface according to the general formula:

$$3Si\ (Solid) + 4NH_3 \rightarrow Si_3N_4\ (Solid) + 6H_2$$

Figure 1F:
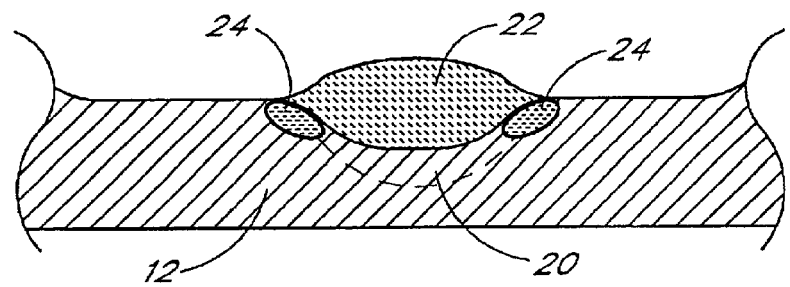

As shown in FIG. 1E. the parasitic nitride inclusions 24 generally crow at the $Si/SiO_2$ interface adjacent to the field oxide 22. Subsequent nitride and pad-oxide etching processes leave the surface of the silicon substrate exposed for further processing. However, the nitride inclusions 24 are also present at the silicon surface, as illustrated in FIG. 1F. Further processing is compromised by the presence of the nitride inclusions 24. For example, subsequent growth of a gate oxide layer requires a thin, high quality oxide having uniform thickness and composition. The nitride inclusions 24 cause the gate oxide to become thinner in these regions which ultimately contributes to device breakdowns. Thus, additional processing is needed to alleviate this problem.

Figure 1G:
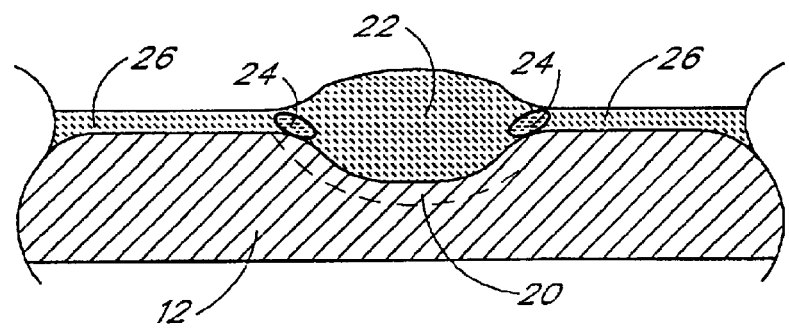
Figure 1H:
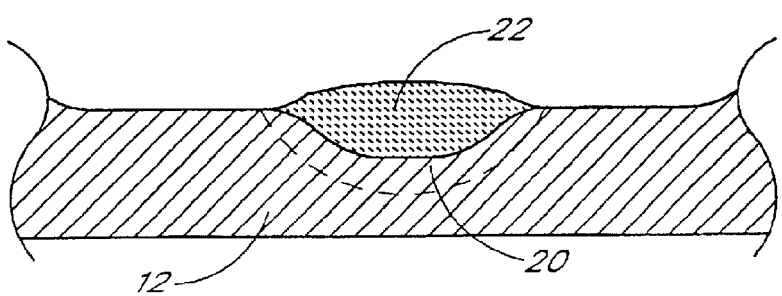

As shown in FIG. 1G, typically a sacrificial oxide layer 26 is grown over the silicon surface to an extent which substantially oxidizes the nitride inclusions 24. The sacrificial oxide 26 is then etched, leaving a silicon surface and field oxide 22 substantially free of the nitride inclusions 24, as illustrated in FIG. 1H. The aforementioned sacrificial oxide growth and removal have, conventionally, been considered necessary process steps for alleviating the Kooi effect.

In accordance with the principles of the present invention, a preferred isolation process comprises utilizing a high pressure field oxidation (HiPox) process using an oxidant substantially free of hydrogen. In this respect, it is preferable to perform a field HiPox process using an oxidant such as oxygen ($O_2$) in place of $H_2O$. Performing the oxidation of silicon at high pressure significantly enhances the oxidation rate, thus compensating a possible lower oxidation rate of $O_2$ relative to that of $H_2O$. Performing a field oxidation using an oxidant, substantially free of hydrogen, such as substantially pure oxygen prevents formation of silicon nitride inclusions via the Kooi effect.

Figure 2A:
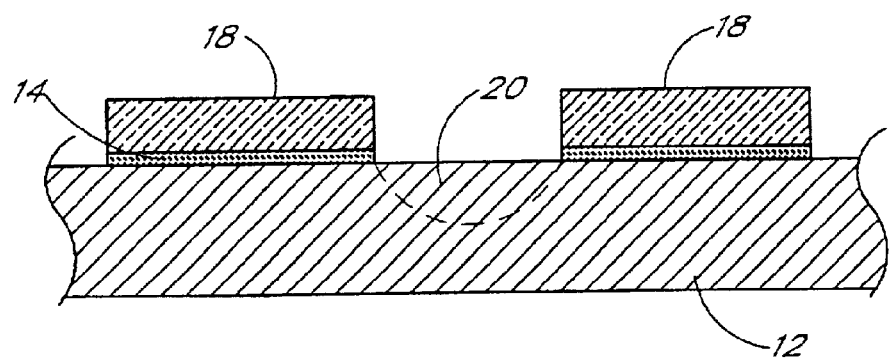
FIGS. 2A–2B is a schematic partial process flow illustrating a field oxide grown by high pressure oxidation.
Figure 2B:
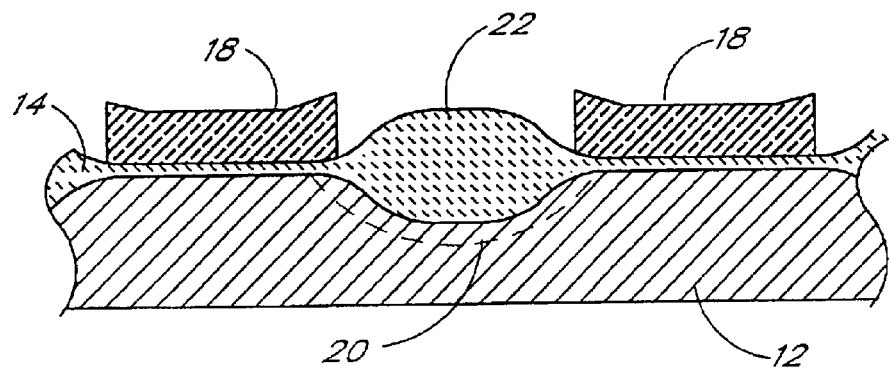

One embodiment of a preferred field oxidation process is illustrated in FIGS. 2A–2B. FIG. 2A illustrates a wafer section processed up to the point of field oxidation. Previous processing steps may be substantially equivalent to that described in connection with FIGS. 1A–1D. As shown in FIG. 2A, a starting structure may comprise the silicon substrate 12, pad-oxide layer 14, nitride mask 18 and optional channel-stop implant 20. FIG. 2B illustrates the result of a high pressure field oxidation using $O_2$ as the oxidant. The field oxide 20 is grown substantially similar to that described previously in connection with FIG. 1E, except that the nitride inclusions 24 are eliminated.

A preferred HiPox process using $O_2$ follows the general formula:

$$Si\ (solid) + O_2 \rightarrow SiO_2\ (solid)$$

It is possible that nitrogen ($N_2$) may be released in a possible accompanying reaction of $O_2$ with the masking nitride 18 according to the following approximate reaction or variations from stoichiometry thereof:

$$2Si_3N_4\ (solid) + O_2 \rightarrow 2Si_3N_2O_2\ (Solid) + 2N_2$$

However, $N_2$ does not react significantly with the underlying silicon, as does the $NH_3$ released in the prior art field oxidation. A HiPox field oxidation is generally performed at partial pressures in the range of 5 atm to 30 atm, and in a temperature range of 900° C. to 1200° C. Resulting oxidation rates may range from 2 nm/min. to 8 nm/min. Preferable HiPox processes are performed at $O_2$ partial pressures of about 25 atm, at 1000° C. resulting in oxidation rates of about 5 nm/min.

Having a field oxide substantially free of nitride inclusions 26 (FIG. 1), allows subsequent processing without the need for sacrificial oxide growth as discussed in connection with FIGS. 1G and 1H.

Figure 3A:
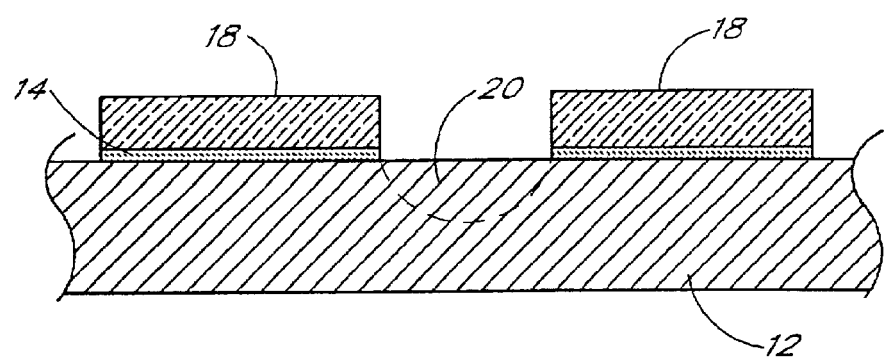
FIGS. 3A–3C is a schematic partial process flow illustrating a field oxide with encapsulated parasitic nitride.
Figure 3B:
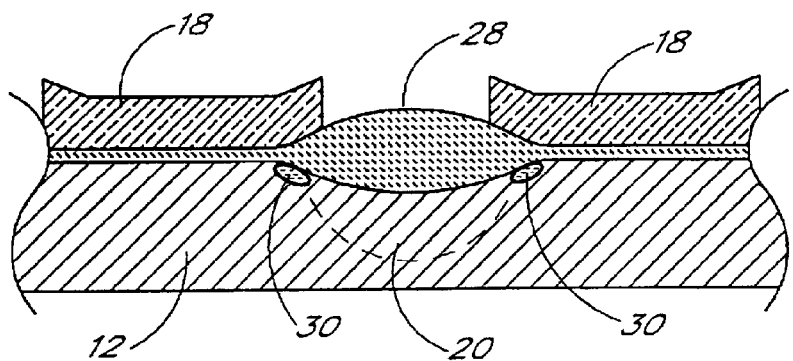
Figure 3C:
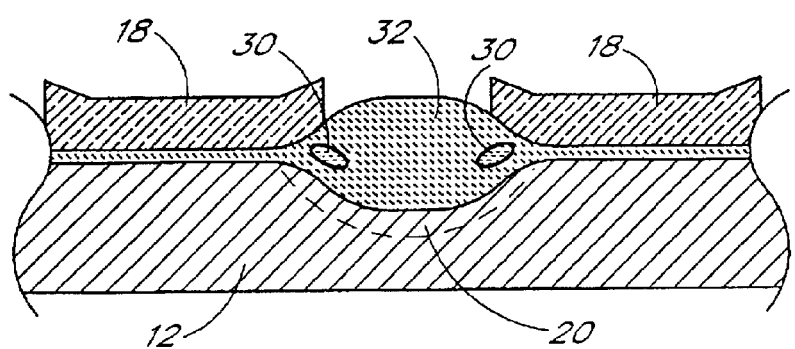

Another preferred field oxidation process comprises a two-step operation, whereby an initial field oxide is grown by wet oxidation followed by a HiPox oxidation step. As shown in FIG. 3A, a possible starting structure may comprise the result of prior processing steps as described in connection with FIGS. 1A–1D. As shown in FIG. 3B, a first partial field oxide 28 is grown by wet oxidation, as previously described in connection with FIG. 1E. The wet oxidation process, however, produces residual nitride inclusions 30. A second field oxidation is then performed by HiPox using an $O_2$ oxidant. As shown in FIG. 3C, the HiPox step substantially completes the field oxide 32, and grows an oxide which consumes the nitride inclusions 30. Since the nitride inclusions are no longer located at the Si/SiO$_2$ interface, their influence on subsequent processing steps is ameliorated. Advantages of the present embodiment include use of the relatively inexpensive and efficient wet oxidation to create a portion of the field oxide, minimizing the more expensive HiPox process and eliminating the need for the sacrificial oxide.

Although described above with reference to the preferred embodiments, modifications within the scope of the invention may be apparent to those skilled in the art, all such modifications are intended to be within the scope of the appended claims.

What is claimed is:

1. A process of forming an integrated circuit, comprising:
    growing a silicon dioxide field isolation region on a semiconductor wafer without forming silicon nitride inclusions in said field isolation region exclusively by means of a hydrogen-free oxidant at a pressure less than about 30 atm; and forming a gate oxide without a prior sacrificial oxidation.

2. The process of claim 1 wherein the oxidant comprises substantially only oxygen.

3. The process of claim 1, further comprising exposing the semiconductor wafer to the oxidant at an oxidant partial pressure greater than 5 atm.

4. The process of claim 1, further comprising maintaining the semiconducting wafer at a temperature greater than 900° C.

5. A field isolation region among integrated circuit devices on a semiconductor substrate formed by a process comprising:
    avoiding the formation of silicon nitride inclusions in the field isolation region by exposing a field region of the semiconductor substrate to a hydrogen-free oxidizing ambient at a pressure between about 5 atm and 30 atm.

6. The field isolation region of claim 5, wherein the semiconductor substrate is maintained at a temperature greater than 200° C. while exposing the field region.

7. A process of forming electrically isolated integrated devices in a silicon substrate, comprising:
    masking portions of the substrate to define unmasked field isolation regions;
    growing field oxide in the field isolation regions without forming silicon nitride inclusions in the field oxide by hydrogen-free oxidation alone at an oxidant partial pressure between about 5 atm and 30 atm and a temperature of greater than about 900° C.; and
    forming electrical devices between the field isolation regions.

8. The process of claim 7, wherein growing the field oxide comprises exposing the field isolation regions to an oxidant consisting essentially of oxygen.

9. A process of forming an integrated circuit on a semiconductor substrate, comprising:
    masking portions of the substrate with a mask comprising silicon nitride;
    growing a field oxide in a single process step by hydrogen-free oxidation alone to a thickness sufficient for electrical isolation of devices within the substrate without forming silicon nitride inclusions therein;
    removing the mask after growing the field oxide; and
    forming a gate oxide of uniform thickness adjacent the field oxide on the semiconductor substrate without performing a prior sacrificial oxidation.

10. The process of claim 9, wherein growing the field oxide further comprises maintaining the oxidant partial pressure at about 5–30 atm.

11. The process of claim 9, wherein growing the field oxide further comprises maintaining the substrate at greater than about 900° C.

* * * * *

UNITED STATES PATENT AND TRADEMARK OFFICE
CERTIFICATE OF CORRECTION

PATENT NO. : 6,835,634 B1
DATED : December 28, 2004
INVENTOR(S) : Fazan et al.

It is certified that error appears in the above-identified patent and that said Letters Patent is hereby corrected as shown below:

Title page,
Item [56], References Cited, OTHER PUBLICATIONS,
"Van Zant," reference, replace "Microchipn" with -- Microchip --.

Column 1,
Line 52, after "reducing" delete ",".

Column 3,
Line 54, replace "crow" with -- grow --.

Column 4,
Line 40, after "(solid)+" replace "$O_2$" with -- $3O_2$ --.

Column 5,
Line 21, after "claim 1" insert -- , --.
Lines 21-22, delete "comprises substantially only" and insert -- consists essentially of --.
Line 23, delete "further comprising" and insert -- wherein forming the field isolation region comprises --.
Line 24, delete "wafer" and insert -- substrate --.
Line 26, delete "claim 1, further comprising" and insert -- claims 3, wherein forming the field isolation region comprises --.
Line 27, delete "semiconducting wafer" and insert -- semiconductor substrate --.
Line 38, delete "200° C." and insert -- 900° C. --.

Signed and Sealed this

Twenty-eighth Day of February, 2006

JON W. DUDAS
*Director of the United States Patent and Trademark Office*